(12) United States Patent
Someya et al.

(10) Patent No.: US 9,514,949 B2
(45) Date of Patent: Dec. 6, 2016

(54) COMPOSITION FOR FORMING ORGANIC HARD MASK LAYER FOR USE IN LITHOGRAPHY CONTAINING POLYMER HAVING ACRYLAMIDE STRUCTURE

(75) Inventors: Yasunobu Someya, Toyama (JP); Yuki Usui, Toyama (JP); Masakazu Kato, Toyama (JP); Tetsuya Shinjo, Toyama (JP); Keisuke Hashimoto, Toyama (JP); Ryo Karasawa, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/116,157

(22) PCT Filed: May 18, 2012

(86) PCT No.: PCT/JP2012/062827
§ 371 (c)(1),
(2), (4) Date: Nov. 7, 2013

(87) PCT Pub. No.: WO2012/161126
PCT Pub. Date: Nov. 29, 2012

(65) Prior Publication Data
US 2014/0106570 A1    Apr. 17, 2014

(30) Foreign Application Priority Data

May 20, 2011 (JP) .................................. 2011-113843

(51) Int. Cl.
| | | |
|---|---|---|
| G03F 7/09 | (2006.01) | |
| G03F 7/11 | (2006.01) | |
| G03F 7/20 | (2006.01) | |
| H01L 21/308 | (2006.01) | |

(52) U.S. Cl.
CPC ........... H01L 21/3081 (2013.01); G03F 7/091 (2013.01); G03F 7/094 (2013.01)

(58) Field of Classification Search
CPC .......... G03F 7/004; G03F 7/09; G03F 7/095; G03F 7/11; G03F 7/20
See application file for complete search history.

(56) References Cited

U.S. PATENT DOCUMENTS

| | | | |
|---|---|---|---|
| 5,652,317 A | | 7/1997 | McCulloch et al. |
| 6,051,361 A | * | 4/2000 | Hattori et al. ............. 430/270.1 |
| 6,090,531 A | | 7/2000 | Mizutani et al. |
| 6,165,684 A | | 12/2000 | Mizutani et al. |
| 6,248,500 B1 | | 6/2001 | Mizutani et al. |
| 6,492,092 B1 | | 12/2002 | Foster et al. |
| 6,808,869 B1 | | 10/2004 | Mizutani et al. |
| 2002/0058204 A1 | * | 5/2002 | Khojasteh et al. ......... 430/270.1 |
| 2011/0177459 A1 | * | 7/2011 | Ogihara et al. .............. 430/323 |
| 2011/0281217 A1 | * | 11/2011 | Maeda ....................... 430/283.1 |
| 2011/0311915 A1 | * | 12/2011 | Kimura et al. ............. 430/271.1 |

FOREIGN PATENT DOCUMENTS

| | | |
|---|---|---|
| JP | A-10-48833 | 2/1998 |
| JP | A-10-239837 | 9/1998 |
| JP | A-2001-27810 | 1/2001 |
| JP | A-2001-505234 | 4/2001 |
| JP | A-2002-539282 | 11/2002 |
| JP | 2006-307179 | * 11/2003 |
| JP | A-2009-25670 | 2/2009 |
| WO | WO 2005/111724 A1 | 11/2005 |
| WO | WO 2009/128513 A1 | 10/2009 |
| WO | WO2010/087232 | * 8/2010 |
| WO | WO 2011/074433 A1 | 6/2011 |

OTHER PUBLICATIONS

Machine translation of JP 2006-307179, published on Nov. 9, 2006.*
International Search Report issued in International Patent Application No. PCT/JP2012/062827 dated Jul. 3, 2012.
Written Opinion issued in International Patent Application No. PCT/JP2012/062827 dated Jul. 3, 2012.

* cited by examiner

*Primary Examiner* — Anca Eoff
(74) *Attorney, Agent, or Firm* — Oliff PLC

(57) ABSTRACT

Whereas, conventionally, ashing had been used at the time of removal, the present invention provides a material for forming an organic hard mask that can be removed by an alkaline aqueous solution, and thus can be expected to reduce damage to the substrate at the time of the removal. A composition for forming an organic hard mask layer comprising: a polymer (A) including a structural unit of Formula (1) and a structural unit of Formula (2); a crosslinkable compound (B) including at least two of blocked isocyanate groups, methylol groups, or $C_{1-5}$ alkoxymethyl groups; and a solvent (C), wherein an organic hard mask layer obtained from the composition for forming an organic hard mask layer is used at the lowest layer in a lithography process using a multi-layer film, Formula (1)

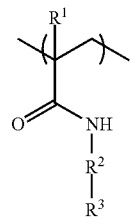

Formula (2)

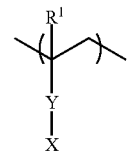

wherein $R^1$ to $R^4$ have the same definition as ones in the specification.

14 Claims, No Drawings

COMPOSITION FOR FORMING ORGANIC HARD MASK LAYER FOR USE IN LITHOGRAPHY CONTAINING POLYMER HAVING ACRYLAMIDE STRUCTURE

TECHNICAL FIELD

The present invention relates to a composition for forming an organic hard mask layer for use in lithography process of manufacturing a semiconductor device and a method for manufacturing a semiconductor device using the composition.

BACKGROUND ART

Micro-fabrication by lithography using a photoresist composition has been carried out in manufacture of a semiconductor device. The micro-fabrication is a processing method in which a thin film of a photoresist composition is formed on a substrate to be processed such as a silicon wafer; the thin film is irradiated with active rays such as ultraviolet rays through a mask pattern in which a pattern of a semiconductor device is drawn and the irradiated thin film is developed; and the processed substrate such as a silicon wafer is processed by etching using the obtained photoresist pattern as a protection film.

In recent years, however, high integration of semiconductor devices has been progressed and wavelengths of active rays used tend to be shorter from KrF excimer laser (248 nm) to ArF excimer laser (193 nm). With this tendency, an effect of diffuse reflection of the active rays from a substrate and an effect of a standing wave have become large issues. Consequently, a method for providing an anti-reflective coating (Bottom Anti-Reflective Coating, BARC) between a photoresist and a processed substrate has been widely studied.

For example, a composition for forming a photosensitive resist underlayer film including a polymer having an acrylamide structure is disclosed (refer to Patent Document 1).

A composition for forming a resist underlayer film including a polymer having a structural unit of hydroxyacrylamide is disclosed (refer to Patent Document 2).

A composition for forming an anti-reflective coating including a polymer having a structural unit of a hydroxyalkylenemethacrylamide and a structural unit of an aromatic alkylene methacrylate is disclosed (refer to Patent Document 3).

In the future, when formation of a finer resist pattern is progressed, an issue of resolution and an issue of resist pattern collapse after development occur, and therefore, formation of a thinner resist will be desired. Consequently, it will be difficult to secure a sufficient resist pattern film thickness for substrate processing. As a result, a process that provides a function as a mask at the time of the substrate processing not only to the resist, but also to a resist underlayer film prepared between the resist and the processed substrate has become necessary. As the resist underlayer film used for the process described above, which is different from a conventional resist underlayer film having a property of a high etching rate (having fast etching rate), a resist underlayer film for lithography having a selectivity ratio of a dry etching rate close to that of the resist, a resist underlayer film for lithography having a selectivity ratio of the dry etching rate smaller than that of the resist, or a resist underlayer film for lithography having a selectivity ratio of the dry etching rate smaller than that of the semiconductor substrate has been required.

PRIOR ART DOCUMENTS

Patent Documents

Patent Document 1: WO 2005/111724 pamphlet
Patent Document 2: Japanese Patent Application Publication No. 2009-025670 (JP 2009-025670 A)
Patent Document 3: Japanese Patent Application Publication No. 2001-027810 (JP 2001-027810 A)

SUMMARY OF THE INVENTION

Problem to be Solved by the Invention

The object of the present invention is to provide a composition for forming an organic hard mask layer for use in lithography process for manufacturing a semiconductor device. Another object of the present invention is to provide an organic hard mask layer for lithography that causes no intermixing with an inorganic hard mask layer, provides an excellent resist pattern, and that has a selectivity ratio of a dry etching rate close to that of the resist, a selectivity ratio of the dry etching rate smaller than that of the resist, or a selectivity ratio of the dry etching rate smaller than that of the semiconductor substrate. Another object of the present invention is to provide an organic hard mask layer for lithography having a function to effectively absorb reflected light from the substrate when radiation light having a wavelength of 248 nm, 193 nm, 157 nm or the like is used in micro-fabrication. Further, still another object of the present invention is to provide a method for manufacturing a semiconductor device using the composition for forming an organic hard mask layer. Yet another object of the present invention is to provide a composition for forming an organic hard mask layer for forming an organic hard mask layer to which dry etching can be carried out at the time of pattern transfer from the upper layer or substrate processing and that can be removed with a solvent after the substrate processing.

Means for Solving the Problem

The present invention provides, according to a first aspect, a composition for forming an organic hard mask layer comprising: a polymer (A) including a structural unit of Formula (1) and a structural unit of Formula (2); a cross-linkable compound (B) including at least two of blocked isocyanate groups, methylol groups, or $C_{1-5}$ alkoxymethyl groups; and a solvent (C), in which an organic hard mask layer obtained from the composition for forming an organic hard mask layer is used at the lowest layer in a lithography process using a multi-layer film,

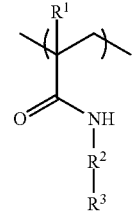

Formula (1)

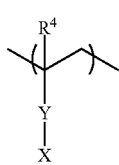

Formula (2)

[in Formula (1), $R^1$ is a hydrogen atom or a methyl group; $R^2$ is a $C_{1-3}$ alkylene group or a phenylene group optionally having a substituent; and $R^3$ is a hydroxy group or a carboxy group, and in Formula (2), $R^4$ is a hydrogen atom or a methyl group; Y is a linking group of a —C(=O)—NH— group or a —C(=O)—O— group; X is a group including a lactone ring, a group including an adamantane ring, a benzene ring group that is optionally substituted, a naphthalene ring group that is optionally substituted, or an anthracene ring group that is optionally substituted; and a carbon atom in the linking group of Y is bonded to a main chain of the polymer];

according to a second aspect, the composition according to the first aspect, in which the polymer (A) is a polymer (A') further including a structural unit of Formula (3) in addition to the structural unit of Formula (1) and the structural unit of Formula (2),

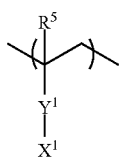

Formula (3)

[in Formula (3), $R^5$ is a hydrogen atom or a methyl group; $Y^1$ is a —C(=O)—NH— group or a —C(=O)—O— group; $X^1$ is a hydrogen atom, a $C_{1-10}$ alkyl group, or a $C_{7-20}$ aralkyl group that is optionally substituted];

according to a third aspect, the composition according to the first aspect, in which the polymer (A) is a polymer (A") further including a structural unit of Formula (4) in addition to the structural unit of Formula (1) and the structural unit of Formula (2),

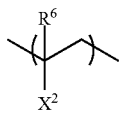

Formula (4)

[in Formula (4), $R^6$ is a hydrogen atom or a methyl group; and $X^2$ is a $C_{6-20}$ aryl group that is optionally substituted];

according to a fourth aspect, the composition according to any one of the first aspect to the third aspect, in which the crosslinkable compound (B) is included in a ratio of 1% by mass to 40% by mass to the mass of the polymer (A), the polymer (A'), or the polymer (A");

according to a fifth aspect, the composition according to any one of the first aspect to the fourth aspect, further comprising a crosslinking catalyst;

according to a sixth aspect, a method for manufacturing a semiconductor device, the method comprising: forming an organic hard mask layer on a semiconductor substrate using the composition for forming an organic hard mask layer as described in any one of the first aspect to the fifth aspect; forming a resist film on the organic hard mask layer; forming a resist pattern in the resist film by radiating light or an electron beam and developing; etching the organic hard mask layer using the resist pattern; and processing the semiconductor substrate using the organic hard mask layer thus patterned; and according to a seventh aspect, a method for manufacturing a semiconductor device, the method comprising: forming an organic hard mask layer on a semiconductor substrate using the composition for forming an organic hard mask layer as described in any one of the first aspect to the fifth aspect; forming an inorganic hard mask layer on the organic hard mask layer; further forming a resist film on the inorganic hard mask layer; forming a resist pattern in the resist film by radiating light or an electron beam and developing; etching the inorganic hard mask layer using the resist pattern; etching the organic hard mask layer using the inorganic hard mask layer thus patterned; and processing a semiconductor substrate using the organic hard mask layer thus patterned.

Effects of the Invention

An organic hard mask layer formed from the composition for forming an organic hard mask layer of the present invention can form an excellent pattern shape of a resist without causing intermixing with an upper layer part of the organic hard mask layer.

The organic hard mask layer formed from the composition for forming an organic hard mask layer of the present invention can also be provide with a function of effectively absorbing reflected light from the substrate, and can also have an effect as an anti-reflective coating for exposure light.

The composition for forming an organic hard mask layer of the present invention can form an excellent organic hard mask layer having a selectivity ratio of a dry etching rate close to that of the resist, a selectivity ratio of the dry etching rate smaller than that of the resist, or a selectivity ratio of the dry etching rate smaller than that of the semiconductor substrate.

With progress of formation of finer resist patterns, formation of a thinner resist film is carried out in order to prevent the resist pattern from collapse after development. In such a thin film resist, there exist a process in which a resist pattern is transferred to its underlayer film in an etching process and substrate processing is carried out by using the underlayer film to which the pattern is transferred as a mask and a process in which a resist pattern is transferred to its underlayer film in an etching process and a process of further transferring the pattern transferred to the underlayer film to an underlayer film of the underlayer film using a different gas composition is repeated, and thereby, finally substrate processing is carried out. The organic hard mask layer and the composition for forming the organic hard mask layer of the present invention are effective for these processes. When a substrate is processed using the organic hard mask layer of the present invention, the organic hard mask layer and the composition for forming the organic hard mask layer of the present invention have sufficient etching resistance to a processing substrate (for example, a thermally oxidized silicon film, a silicon nitride film, and a polysilicon film on the substrate).

The organic hard mask layer of the present invention can be used for a planarizing film, an antifouling film for a resist layer, and a film having dry etch selectivity. This makes it possible to easily form a resist pattern in a lithography process of a semiconductor manufacturing with high accuracy.

There is a process in which an organic hard mask layer formed from the composition for forming an organic hard mask layer of the present invention is formed on a substrate; an inorganic hard mask layer is formed thereon; a resist film is formed thereon; a resist pattern is formed in the resist film by light exposure and development; the resist pattern is transferred to the inorganic hard mask layer; the resist pattern transferred to the inorganic hard mask layer is transferred to the organic hard mask layer; and a semiconductor substrate is processed by using the resist pattern transferred to the organic hard mask layer.

In the organic hard mask layer formed from the composition for forming an organic hard mask layer of the present invention, the resist pattern transferred to the inorganic hard mask layer that is an upper layer can be transferred to the organic hard mask layer by dry etching. By using the resist pattern transferred to the organic hard mask layer, the semiconductor substrate can be processed by dry etching.

After the semiconductor substrate is processed, the organic hard mask layer of the present invention can be removed by an aqueous alkali solution, depending on a used crosslinking agent and crosslinking catalyst.

MODES FOR CARRYING OUT THE INVENTION

The present invention includes a composition for forming an organic hard mask layer comprising: a polymer (A) including a structural unit of Formula (1) and a structural unit of Formula (2); a crosslinkable compound (B) including at least two of blocked isocyanate groups, methylol groups, and $C_{1-5}$ alkoxymethyl groups; and a solvent (C), in which an organic hard mask layer obtained from the composition for forming an organic hard mask layer is used at the lowest layer in a lithography process using a multi-layer film.

The composition for forming an organic hard mask layer of the present invention may include additives such as an acid generator and a surfactant, if necessary. A ratio of a solid content in the composition is 0.1% by mass to 70% by mass or 0.1% by mass to 60% by mass. The solid content means residual components after a solvent (C) is removed from the composition for forming an organic hard mask layer.

The solid content may include the polymer (A), the polymer (A'), or the polymer (A") in a ratio of 1% by mass to 99.9% by mass, 1% by mass to 99% by mass, or 50% by mass to 98% by mass.

In the structural unit of Formula (1), $R^1$ is a hydrogen atom or a methyl group, $R^2$ is a $C_{1-3}$ alkylene group or a phenylene group optionally having a substituent, and $R^3$ is a hydroxy group or a carboxy group.

Examples of the substituent may include an alkyl group, a halogen atom, a nitro group, and an amino group.

Examples of the alkylene group may include a methylene group, an ethylene group, and a propylene group.

In the structural unit of Formula (2), $R^4$ is a hydrogen atom or a methyl group, Y is a linking group of a —C(=O)—NH— group or a —C(=O)—O— group, X is a group including a lactone ring, a group including an adamantane ring, a benzene ring group that is optionally substituted, a naphthalene ring group that is optionally substituted, or an anthracene ring group that is optionally substituted, and a carbon atom in the linking group of Y is bonded to a main chain of the polymer. As the substituent, the substituents described above can be exemplified.

The structural units of Formula (1) used in the present invention are exemplified as follows.

Formula (1-1)

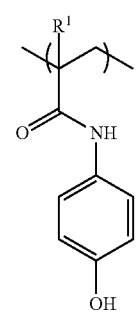

Formula (1-2)

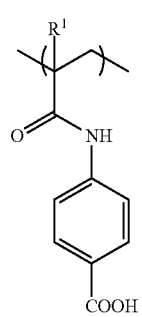

Formula (1-3)

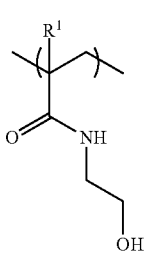

[In Formula (1-1) to Formula (1-3), $R^1$ is a hydrogen atom or a methyl group.]

In Formula (2), X is a group including a lactone ring, a group including an adamantane ring, a benzene ring group that is optionally substituted, a naphthalene ring group that is optionally substituted, or an anthracene ring group that is optionally substituted. The lactone ring may be not only a five-membered ring such as γ-butyrolactone, but also a six-membered ring such as δ-valerolactone, and a seven-membered ring such as ε-caprolactone.

The structural units of Formula (2) used in the present invention are exemplified as follows.

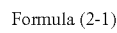

Formula (2-1)

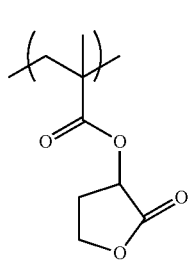

-continued

Formula (2-2)
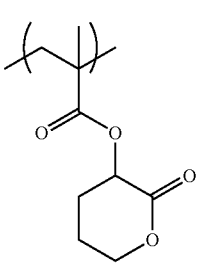

Formula (2-3)
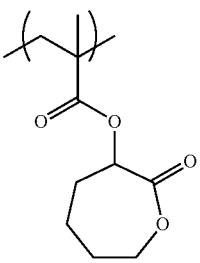

Formula (2-4)
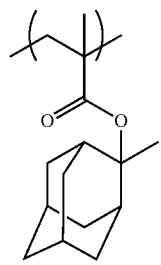

Formula (2-5)
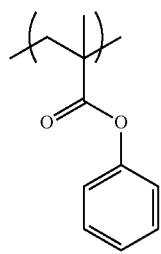

Formula (2-6)
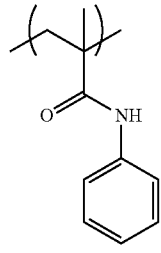

The polymer (A) may be a copolymer having a combination of the structural unit of Formula (1) and the structural unit of Formula (2).

In the polymer (A), the structural unit of Formula (1) and the structural unit of Formula (2) can be used in a molar ratio of 1:0.01 to 1.5 or 1:0.1 to 0.8.

A weight-average molecular weight of the polymer (A) is, for example, 1000 to 200000, and preferably 3000 to 20000. When the weight-average molecular weight of the polymer (A) is less than 1000, solvent resistance of the organic hard mask layer obtained from the composition for forming an organic hard mask layer of the present invention may be insufficient. The weight-average molecular weight is a value measured by gel permeation chromatography (GPC) using polystyrene as a standard sample.

In the present invention the polymer (A') can be used instead of the polymer (A). The polymer (A') is a polymer including the structural unit of Formula (1), the structural unit of Formula (2), and the structural unit of Formula (3).

In Formula (3), $R^5$ is a hydrogen atom or a methyl group, $Y^1$ is a —C(=O)—NH— group or a —C(=O)—O— group, $X^1$ is a hydrogen atom, a $C_{1-10}$ alkyl group, or a $C_{7-20}$ aralkyl group that is optionally substituted.

Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{7-20}$ aralkyl group include a benzyl group, an o-methylbenzyl group, a m-methylbenzyl group, a p-methylbenzyl group, an o-chlorobenzyl group, a m-chlorobenzyl group, a p-chlorobenzyl group, an o-fluorobenzyl group, a p-fluorobenzyl group, an o-methoxybenzyl group, a p-methoxybenzyl group, a p-nitrobenzyl group, a p-cyanobenzyl group, a phenethyl group, an o-methylphenethyl group, a m-methylphenethyl group, a p-methylphenethyl group, an o-chlorophenethyl group, a m-chlorophenethyl group, a p-chlorophenethyl group, an o-fluorophenethyl group, a p-fluorophenethyl group, an o-methoxyphenethyl group, a p-methoxyphenethyl group, a p-nitrophenethyl group, a p-cyanophenethyl group, a 3-phenylpropyl group, a 4-phenylbutyl group, a 5-phenylpentyl group, a 6-phenylhexyl group, an α-naphthylmethyl group, a β-naphthylmethyl group, an o-biphenylylmethyl group, a m-biphenylylmethyl group, a p-biphenylylmethyl group, a 1-anthrylmethyl group, a 2-anthrylmethyl group, a 9-anthrylmethyl group, a 1-phenanthrylmethyl group, a 2-phenanthrylmethyl group, a 3-phenanthrylmethyl group, a 4-phenanthrylmethyl group, a 9-phenanthrylmethyl group, an α-naphthylethyl group, a β-naphthylethyl group, an o-biphenylylethyl group, a m-biphenylylethyl group, a p-biphenylylethyl group, a 1-anthrylethyl group, a 2-anthrylethyl group, a 9-anthrylethyl group, a 1-phenanthrylethyl group, a 2-phenanthrylethyl group, a 3-phenanthrylethyl group, a 4-phenanthrylethyl group, and 9-phenanthrylethyl group.

The structural units of Formula (3) used in the present invention are exemplified as follows.

Formula (3-1)

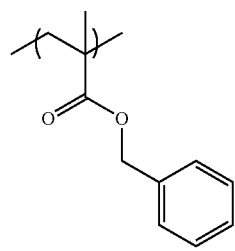

Formula (3-2)

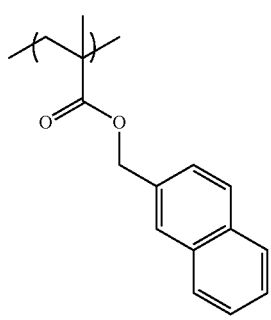

Formula (3-3)

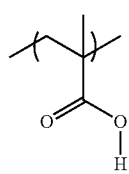

Formula (3-4)

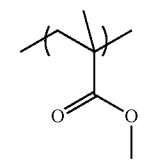

Formula (3-5)

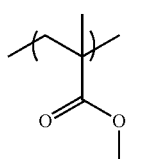

Formula (3-6)

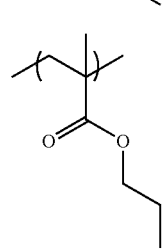

In the present invention the polymer (A") can be used instead of the polymer (A). The polymer (A") is a polymer including the structural unit of Formula (1), the structural unit of Formula (2), and the structural unit of Formula (4).

In Formula (4), $R^6$ is a hydrogen atom or a methyl group and $X^2$ is a $C_{6-20}$ aryl group that is optionally substituted.

Examples of the $C_{6-20}$ aryl group include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

The structural units of Formula (4) used in the present invention are exemplified as follows.

Formula (4-1)

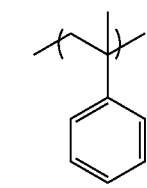

Formula (4-2)

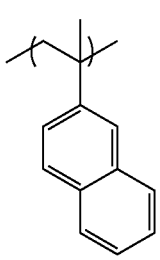

The crosslinkable compound (B) used in the present invention is, for example, a nitrogen containing compound that does not include an epoxy group, or a compound that include at least one aryl group. Examples of the aryl group include a phenyl group and a naphthyl group.

Preferably, the crosslinkable compound (B) is a crosslinkable compound that has at least two of blocked isocyanate groups, methylol groups, or $C_{1-5}$ alkoxymethyl groups.

The crosslinkable compound (B) can be used in a similar molecular weight range even when the polymer (A') or the polymer (A") is used instead of the polymer (A).

The crosslinkable compound (B) is included in the composition for forming an organic hard mask layer in a ratio of 1% by mass to 40% by mass, preferably 1% by mass to 30% by mass to the mass of the polymer (A), the polymer (A'), or the polymer (A").

Specific examples of the crosslinkable compound (B) containing at least two blocked isocyanate groups include Takenate [registered trademark] B-830 and B-870N (manufactured by Mitsui Chemicals Co., Ltd.) and VESTANAT [registered trademark] B1358/100 (manufactured by Evonik Degussa Corporation).

The blocked isocyanate group is a compound in which an isocyanate group (—N=C=O) is blocked with an adequate protection group. Examples of blocking agents include alcohols such as methanol, ethanol, isopropanol, n-butanol, 2-ethoxy-hexanol, 2-N,N-dimethylaminoethanol, 2-ethoxyethanol, and cyclohexanol; phenols such as phenol, o-nitrophenol, p-chlorophenol, o-cresol, m-cresol and p-cresol; lactams such as ε-caprolactam; oximes such as acetone oxime, methyl ethyl ketone oxime, methyl isobutyl ketone oxime, cyclohexanone oxime, acetophenone oxime, and benzophenone oxime; pyrazoles such as 3,5-dimethylpyrazole, 3-methylpyrazole; and thiols such as dodecanethiol, and benzenethiol.

Examples of the crosslinkable compound (B) that has at least two of the methylol groups or the $C_{1-5}$ alkoxymethyl groups include a melamine-based compound, a substituted urea-based compound, or a polymer thereof. Specific examples of the compounds include methoxy-methylated glycoluril, butoxy-methylated glycoluril, methoxy-methylated melamine, butoxy-methylated melamine, methoxy-methylated benzoguanamine, butoxy-methylated benzoguanamine, methoxy-methylated urea, urea butoxy-methylated urea, methoxy-methylated thiourea, and methoxy-methylated thiourea. Condensed products of these compounds can also be used.

In the composition for forming an organic hard mask layer of the present invention, acidic compounds such as p-toluenesulfonic acid, trifluoromethanesulfonic acid, pyridinium p-toluenesulfonate, salicylic acid, sulfosalicylic acid, citric acid, benzoic acid, hydroxybenzoic acid, and naphthalene carboxylic acid, and thermal acid generators such as 2,4,4,6-tetrabromocyclohexadienone, benzoin tosylate, 2-nitrobenzyl tosylate, and organic sulfonic acid alkyl esters can be formulated as a catalyst for accelerating the crosslinking reaction (hereinafter, also called a crosslinking catalyst). A formulation amount to the total solid content is 0.0001% by mass to 20% by mass, preferably 0.0005% by mass to 10% by mass, and preferably 0.01% by mass to 3% by mass.

To the composition for forming an organic hard mask layer of the present invention, a photoacid generator can be added in order to match acidity of the composition with acidity of a photoresist covering the upper layer in a lithography process. Examples of the preferable photoacid generator include onium salt-based photoacid generators such as bis(4-t-butylphenyl)iodonium trifluoromethanesulfonate and triphenylsulfonium trifluoromethanesulfonate, halogen-containing compound-based photoacid generators such as phenyl-bis(trichloromethyl)-s-triazine, sulfonate-based photoacid generators such as benzoin tosylate and N-hydroxysuccinimide trifluoromethanesulfonate. A formulation amount of the photoacid generator to the total solid content is 0.2% by mass to 10% by mass, and preferably 0.4% by mass to 5% by mass.

To the composition for forming an organic hard mask layer of the present invention, a light absorber, a rheology modifier, an adhesion assistant, and a surfactant may be added in addition to the above-described substances, if necessary.

For example, as the light absorbers, commercially available light absorbers described in "Technology and market of industrial dye" (CMC Publishing Co., Ltd.) and "Dye Handbook" (edited by The Society of Synthetic Organic Chemistry, Japan) such as C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; I. C. Solvent Red 1, 3, 8, 23, 24, 25, 27, and 49; C. I. Pigment Green 10; and C. I. Pigment Brown 2 can preferably be used. The light absorber is usually formulated to the total solid content of the composition for forming an organic hard mask layer in a ratio of 10% by mass or less, and preferably 5% by mass or less.

The rheology modifier is added in order to mainly improve fluidity of the composition for forming an organic hard mask layer and in order to improve uniformity of the thickness of the organic hard mask layer and to improve filling ability of the composition for forming an organic hard mask layer into the inside of a hole, particularly, in a baking process. Specific examples thereof include phthalic acid derivatives such as dimethyl phthalate, diethyl phthalate, di-isobutyl phthalate, dihexyl phthalate, and butyl isodecyl phthalate; adipate derivatives such as di-normal-butyl adipate, di-isobutyl adipate, di-isooctyl adipate, and octyldecyl adipate; maleic acid derivatives such as di-normal-butyl maleate, diethyl maleate, and dinonyl-maleate; oleic acid derivatives such as methyl oleate, butyl oleate, and tetrahydrofurfuryl oleate; and stearic acid derivatives such as normal-butyl stearate and glyceryl stearate. These rheology modifiers are usually formulated in a ratio of less than 30% by mass to the total solid content of the composition for forming an organic hard mask layer.

The adhesion assistant is added in order to mainly improve adhesion between the substrate or the resist film and the organic hard mask layer and in order to prevent the resist film from delamination particularly in development. Specific examples thereof include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and a phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; ureas such as 1,1-dimethylurea, and 1,3-dimethylurea; and thiourea compounds. These adhesion assistants are usually formulated in a ratio of less than 5% by mass, and preferably less than 2% by mass to the total solid content of the composition for forming an organic hard mask layer.

In the composition for forming an organic hard mask layer of the present invention, the surfactant may be formulated in order to cause no pinhole and striation and to further improve coatability to an irregular surface. Examples of the surfactant include nonionic surfactants of polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; and fluorine-based surfactants such as EFTOP [registered trademark] EF301, EF303, and EF352, [manufactured by MITSUBISHI Materials Electronic Chemicals Co., Ltd. (former Tohkem Products Corporation), trade name], Megafac [registered trademark] F171, F173, and R-30 [manufactured by DIC Corporation (former Dainippon Ink Co., Ltd.), trade name], Fluorad FC430 and FC431 (manufactured by Sumitomo 3M Ltd., trade name), AsahiGuard [registered trademark] AG710, Surflon [registered trademark] S-382, SC101, SC102, SC103, SC104, SC105, and SC106 (manufactured by Asahi Glass Co., Ltd., trade name); and organosiloxane polymer KP341 (manufactured by Shin-Etsu Chemical Co., Ltd.). A formulation amount of these surfactants to the total solid content of the composition for forming an organic hard mask layer of the present invention is usually 2.0% by mass or less, and preferably 1.0% by mass or less. These surfactants may be used singly or in combination of two or more of the surfactants.

In the present invention, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and the like can be used as the solvent (C) that dissolves the polymer, the crosslinkable compound, the crosslinking catalyst, and the like. These solvents may be used singly or in combination of two or more of the solvents.

Furthermore, a solvent having a high boiling point such as propylene glycol monobutyl ether and propylene glycol monobutyl ether acetate can be mixed and used. Among these solvents, propylene glycol monomethyl ether, propylene glycol monomethyl ether acetate, ethyl lactate, butyl lactate, and cyclohexanone are preferable from the viewpoint of further improving a levering property.

A photoresist and an electron beam resist can be used as the resist used in the present invention.

Both negative type resist and positive type resist can be used as the photoresist formed on the upper part of the organic hard mask layer formed from the composition for forming an organic hard mask layer of the present invention. Examples of the photoresist include the positive type photoresists made of a novolac resin and a 1,2-naphthoquinone diazide sulfonic acid ester; a chemical amplification type photoresist made of a binder having a group that is decomposed by acid to increase a rate of dissolution in alkali and a photoacid generator; a chemical amplification type photoresist made of an alkali-soluble binder, a low molecular weight compound that is decomposed by acid to increase the rate of dissolution in alkali and a photoacid generator; a chemical amplification type photoresist made of the binder having a group that is decomposed by acid to increase the rate of dissolution in alkali, a low molecular weight compound that is decomposed by acid to increase the rate of dissolution in alkali, and a photoacid generator; and a photoresist having Si atoms in its skeleton. APEX-E (trade name, manufactured by Rohm and Haas Corporation) can be exemplified.

Examples of the electron beam resist formed on the upper part of the organic hard mask layer formed from the composition for forming an organic hard mask layer of the present invention include a composition made of a resin that includes Si—Si bonds in its main chain and an aromatic ring at its end and an acid generator that generates acid by electron beam irradiation and a composition made of poly (p-hydroxystyrene) in which its hydroxy group is substituted with an organic group including N-carboxyamine and the acid generator that generates acid by electron beam irradiation. In the latter electron beam resist composition, the acid generated from the acid generator by the electron beam irradiation reacts with the N-carboxy aminoxy groups in the polymer side chain and the polymer side chain is decomposed into a hydroxy group and exhibits alkali solubility. As a result, the resist composition is dissolved into an alkali developer to form a resist pattern. Examples of the acid generator that generates an acid by electron beam irradiation include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts such as triphenylsulfonium salts and diphenyliodonium salts; and sulfonic acid esters such as nitrobenzyl tosylate and dinitrobenzyl tosylate.

As the developer of the resist having the organic hard mask layer formed by using the composition for forming an organic hard mask layer of the present invention, aqueous alkali solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine, and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine can be used. To the aqueous solutions of the alkalis described above, an adequate amount of alcohols such as isopropyl alcohol or a surfactant such as a nonionic surfactant can be added and the mixture can be used. Among them, the developer is preferably the quaternary ammonium salt and more preferably tetramethylammonium hydroxide and choline.

A method for forming the resist pattern of the present invention will be described. A coating type organic hard mask layer is prepared by applying the composition for forming an organic hard mask layer on a substrate used in production of precision integrated circuit devices (for example, a silicon/silicon dioxide coating, and transparent substrates such as a glass substrate and an ITO substrate) by an adequate coating method such as a method using a spinner or a coater, and thereafter, baking and curing the coating. A film thickness of the organic hard mask layer is preferably 0.01 μm to 3.0 μm. Conditions for the baking after applying the composition are at 80° C. to 400° C. for 0.5 minutes to 120 minutes. Thereafter, a resist composition is directly applied onto the organic hard mask layer or applied after a layer of or several layers of coating materials are formed, if necessary, and is cured to form a resist film. The resist film is irradiated with light or electron beam through a predetermined mask and is developed, rinsed, and dried to obtain an excellent resist pattern. Post exposure bake (PEB) after light or electron beam irradiation can also be carried out, if necessary. The organic hard mask layer is removed by dry etching using the resist in which the pattern is formed to form a pattern. A desired pattern can be formed on the substrate by using the organic hard mask layer in which the pattern is formed.

Exposure light used for the photoresist is actinic rays such as near-ultraviolet rays, far-ultraviolet rays, and extreme-ultraviolet rays (for example, EUV), and, for example, light having wavelength such as 248 nm (KrF laser light), 193 nm (ArF laser light), and 157 nm ($F_2$ laser light) is used. The light radiation is not particularly limited as long as a method can generate acid from the photoacid generator, and an amount of exposed light is 1 mJ/cm$^2$ to 2000 mJ/cm$^2$, or 10 mJ/cm$^2$ to 1500 mJ/cm$^2$, or 50 mJ/cm$^2$ to 1000 mJ/cm$^2$.

Electron beam irradiation to the electron beam resist can be carried out by using, for example, an electron beam radiation device.

In the present invention, a semiconductor device can be manufactured through processes including the steps of: forming an organic hard mask layer on a semiconductor substrate by using the composition for forming an organic hard mask layer; forming a resist film on the organic hard mask layer; forming a resist pattern in the resist layer by radiating light or electron beam and developing; etching the organic hard mask layer by using the resist pattern; and processing a semiconductor substrate by using the patterned organic hard mask layer.

In the future, when formation of a finer resist pattern is progressed, an issue of resolution and an issue of resist pattern collapse after development occur, and therefore, formation of a thinner resist is desired. Consequently, it is difficult to secure a resist pattern film thickness sufficient for substrate processing. As a result, a process that provides a function as a mask at the time of processing the substrate not only to the resist, but also to an organic hard mask layer prepared between the resist and the substrate to be processed has become necessary. As the organic hard mask layer used for the process described above, which is different from a conventional organic hard mask layer having a property of a high etching rate, an organic hard mask layer for lithography having a selectivity ratio of a dry etching rate close to that of the resist, an organic hard mask layer for lithography having a selectivity ratio of the dry etching rate smaller than that of the resist, or an organic hard mask layer for lithography having a selectivity ratio of the dry etching rate smaller than that of the semiconductor substrate has been required. Antireflection properties can also be imparted to the organic hard mask layer described above, and thus, the organic hard mask layer can also have a function of a conventional anti-reflective coating.

On the other hand, in order to acquire a fine resist pattern, a process in which pattern widths of the resist pattern and the organic hard mask layer at the time of dry etching of the organic hard mask layer are set narrower than the pattern width at the resist development is started to be used. As the organic hard mask layer for the process described above, an organic hard mask layer having a selectivity of a dry etching rate close to the resist, which is different from a conventional anti-reflective coating having high etching rate properties, has been required. Antireflection properties can also be imparted to the organic hard mask layer described above, and thus, the organic hard mask layer can also have a function of a conventional anti-reflective coating.

In the present invention, after the organic hard mask layer of the present invention is formed on a substrate, a resist composition can be directly applied onto the organic hard mask layer or can be applied after a layer of or several layers of coating materials are formed, if necessary. Thereafter, the resist composition is applied and the resist can be formed. This makes it possible to process the substrate by selecting adequate etching gas even if the pattern width of the resist is made narrow and the resist is thinly covered so that pattern collapse can be prevented.

In other words, a semiconductor device can be manufactured through the method including the steps of forming an organic hard mask layer on a semiconductor substrate using the composition for forming an organic hard mask layer; forming an inorganic hard mask layer on the organic hard mask layer; further forming a resist film on the inorganic hard mask layer; forming a resist pattern in the resist film by radiating light or electron beam and developing; etching the inorganic mask layer using the resist pattern; etching the organic hard mask layer using the patterned inorganic hard mask layer; and processing the semiconductor substrate using the patterned organic hard mask layer.

When an effect as an anti-reflective coating is considered, the organic hard mask layer formed from the composition for forming an organic hard mask layer of the present invention, in which a light absorption part is incorporated in the skeleton, has high antireflection effect because no substances are diffused into the photoresist at the time of heating and drying and the light absorption part has a sufficiently high light absorption property.

The organic hard mask layer formed form the composition for forming an organic hard mask layer of the present invention has high thermal stability, can prevent contamination to the upper film caused by decomposed substances at the time of baking, and can provide sufficient temperature margin of the baking process.

In some process conditions, the organic hard mask layer formed form the composition for forming an organic hard mask layer of the present invention can be used as a film having a function of prevention of light reflection and further a function of prevention of interaction between the substrate and the photoresist or prevention of adverse effect to the substrate that is caused by materials used in the photoresist or substances generated at the time of exposure of the photoresist to light.

After the semiconductor substrate is processed, the organic hard mask layer of the present invention can be removed by an aqueous alkali solution, depending on a crosslinking agent and a crosslinking catalyst.

EXAMPLES

Weight-average molecular weights of polymers in Synthesis Example 1 to Synthesis Example 6 in this specification are measurement results measured by gel permeation chromatography (GPC).

In the measurement, GPC apparatus manufactured by Tosoh Corporation was used and the measurement conditions are as follows.

GPC column: Shodex [registered trademark].Asahipak [registered trademark]
(manufactured by Showa Denko Co., Ltd.)
Column temperature: 40° C.
Solvent: N,N-dimethylformamide (DMF)
Flow rate: 0.6 mL/min
Standard sample: Polystyrene (manufactured by Tosoh Corporation)

Synthesis Example 1

To 72 g of propylene glycol monomethyl ether, 12.0 g of 4-hydroxyphenyl methacrylamide, 4.9 g of γ-butyrolactone methacrylate, and 1.2 g of 2,2'-azobisisobutyronitrile were added and dissolved. Into a 300 ml flask in which 91 g of propylene glycol monomethyl ether is heated at 85° C., this solution was added dropwise. After completion of the dropwise addition, the obtained solution was stirred for about 15 hours. After completion of the reaction, a polymer was precipitated by adding the solution dropwise to a mixed solution of ethyl acetate/hexane. The obtained precipitate was filtered with suction. The filtered residue was washed with a mixed solution of ethyl acetate/hexane and thereafter dried at 50° C. under reduced pressure overnight to obtain 12.0 g of a polymer. The obtained polymer was equivalent to Formula (3-1). A weight-average molecular weight Mw determined by GPC in terms of polystyrene was 10,700.

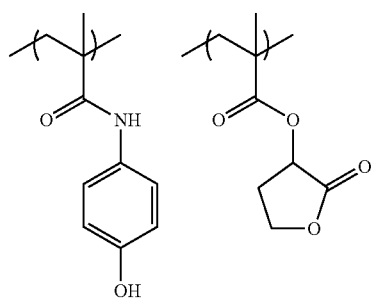

Formula (3-1)

Synthesis Example 2

To 17 g of propylene glycol monomethyl ether, 2.0 g of 4-hydroxyphenyl methacrylamide, 0.8 g of phenyl methacrylamide, and 0.6 g of 2,2'-azobisisobutyronitrile were added and dissolved. Thereafter, the solution was heated and stirred at 85° C. for about 15 hours. After completion of the reaction, a polymer was precipitated by adding the solution dropwise to a mixed solution of ethyl acetate/hexane. The obtained precipitate was filtered with suction. The filtered residue was washed with a mixed solution of ethyl acetate/hexane and thereafter dried at 50° C. under reduced pressure overnight to obtain 45.7 g of a polymer. The obtained polymer was equivalent to Formula (3-2). A weight-average molecular weight Mw determined by GPC in terms of polystyrene was 19,000.

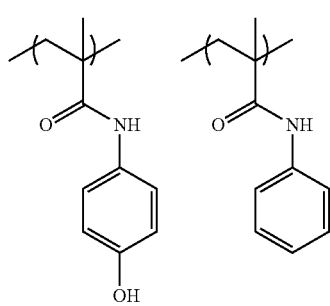

Formula (3-2)

Synthesis Example 3

To 190 g of propylene glycol monomethyl ether, 4.0 g of 4-hydroxyphenyl methacrylamide, 5.8 g of γ-butyrolactone methacrylate, 9.9 g of benzyl methacrylate, and 1.4 g of 2,2'-azobisisobutyronitrile were added and dissolved. Thereafter, the solution was heated and stirred at 85° C. for about 15 hours. After completion of the reaction, a polymer was precipitated by adding the solution dropwise to a mixed solution of ethyl acetate/hexane. The obtained precipitate was filtered with suction. The filtered residue was washed with a mixed solution of ethyl acetate/hexane and thereafter dried at 50° C. under reduced pressure overnight to obtain 11.3 g of a polymer. The obtained polymer was equivalent to Formula (3-3). A weight-average molecular weight Mw determined by GPC in terms of polystyrene was 6,000.

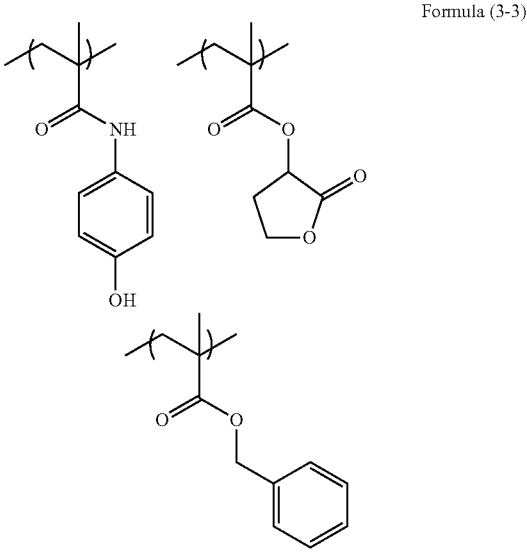

Formula (3-3)

Comparative Synthesis Example 1

To 134.6 g of methyl isobutyl ketone, 20.0 g of acenaphthylene, 6.9 g of N-n-butoxymethyl acrylamide, 4.6 g of styrene, and 2.2 g of 2,2'-azobisisobutyronitrile were added and dissolved. Thereafter, the solution was heated and stirred at 90° C. for about 8 hours. After completion of the reaction, a polymer was precipitated by adding the solution dropwise to methanol. The obtained precipitate was filtered with suction. The filtered residue was washed with methanol and thereafter dried at 50° C. under reduced pressure overnight to obtain 13.8 g of a polymer. The obtained polymer was equivalent to Formula (3-4). A weight-average molecular weight Mw determined by GPC in terms of polystyrene was 2,300.

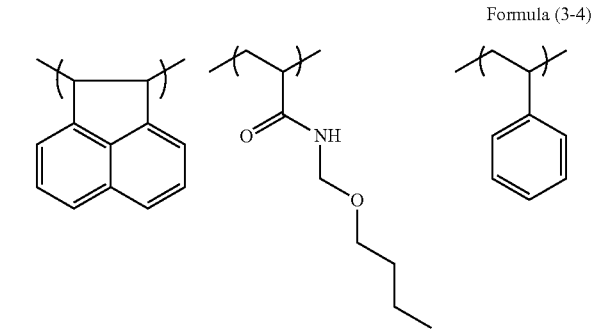

Formula (3-4)

Example 1

To 23 g of propylene glycol monomethyl ether, 2 g of the polymer obtained in Synthesis Example 1, 0.2 g of isocyanate-based crosslinking agent (manufactured by Mitsui Chemicals Inc, trade name: Takenate [registered trademark] B-830), and 0.01 g of a surfactant (manufactured by Neos Co., Ltd., product name: Ftergent [registered trademark] 208G, its component is a fluorine-based surfactant) were added and dissolved to form a solution. Thereafter, the solution was filtered using a microfilter made of polyethylene having a pore size of 0.2 µM to prepare a solution of a composition for forming an organic hard mask layer used for a lithography process by using a multilayer film.

Example 2

To 20.7 g of propylene glycol monomethyl ether and 2.3 g of propylene glycol monomethyl ether acetate, 2 g of the polymer obtained in Synthesis Example 1, 0.2 g of isocyanate-based crosslinking agent (manufactured by Mitsui Chemicals Inc, trade name: Takenate [registered trademark] B-870N), and 0.01 g of a surfactant (manufactured by Neos Co., Ltd., product name: Ftergent [registered trademark] 208G, its component is a fluorine-based surfactant) were added and dissolved to form a solution. Thereafter, the solution was filtered using a microfilter made of polyethylene having a pore size of 0.2 µm to prepare a solution of a composition for forming an organic hard mask layer used for a lithography process by using a multilayer film.

Example 3

To 23 g of propylene glycol monomethyl ether, 2 g of the polymer obtained in Synthesis Example 2, 0.2 g of isocyanate crosslinking agent (manufactured by Mitsui Chemicals Inc, trade name: Takenate [registered trademark] B-830), and 0.01 g of a surfactant (manufactured by Neos Co., Ltd., product name: Ftergent [registered trademark] 208G, its component is a fluorine-based surfactant) were added and dissolved to form a solution. Thereafter, the solution was filtered using a microfilter made of polyethylene having a pore size of 0.2 µm to prepare a solution of a composition for forming an organic hard mask layer used for a lithography process by using a multilayer film.

Example 4

To 20.7 g of propylene glycol monomethyl ether and 2.3 g of propylene glycol monomethyl ether acetate, 2 g of the polymer obtained in Synthesis Example 1, 0.3 g of tetramethoxymethylglycoluril [Formula (5)], and 0.01 g of a surfactant (manufactured by Neos Co., Ltd., product name: Ftergent [registered trademark] 208G, its component is a fluorine-based surfactant) were added and dissolved to form a solution. Thereafter, the solution was filtered using a microfilter made of polyethylene having a pore size of 0.2 to prepare a solution of a composition for forming an organic hard mask layer used for a lithography process by using a multilayer film.

Example 5

To 20.7 g of propylene glycol monomethyl ether and 2.3 g of propylene glycol monomethyl ether acetate, 2 g of the polymer obtained in Synthesis Example 1, 0.3 g of tetramethoxymethylglycoluril [Formula (5)], 0.03 g of pyridinium p-toluenesulfonate as a crosslinking catalyst, and 0.01 g of a surfactant (manufactured by Neos Co., Ltd., product name: Ftergent [registered trademark] 208G, its component is a fluorine-based surfactant) were added and dissolved to form a solution. Thereafter, the solution was filtered using a microfilter made of polyethylene having a pore size of 0.2 µm to prepare a solution of a composition for forming an organic hard mask layer used for a lithography process by using a multilayer film.

Example 6

To 20.7 g of propylene glycol monomethyl ether and 2.3 g of propylene glycol monomethyl ether acetate, 2 g of the polymer obtained in Synthesis Example 3, 0.3 g of tetramethoxymethylglycoluril [Formula (5)], 0.03 g of pyridinium p-toluenesulfonate as a crosslinking catalyst, and 0.01 g of a surfactant (manufactured by Neos Co., Ltd., product name: Ftergent [registered trademark] 208G, its component is a fluorine-based surfactant) were added and dissolved to form a solution. Thereafter, the solution was filtered using a microfilter made of polyethylene having a pore size of 0.2 µm to prepare a solution of a composition for forming an organic hard mask layer used for a lithography process by using a multilayer film.

Comparative Example 1

To 18.0 g of propylene glycol monomethyl ether acetate and 4.5 g of propylene glycol monomethyl ether, 2 g of the polymer obtained in Comparative Synthesis Example 1, 0.4 g of tetramethoxymethylglycoluril [Formula (5)], and 0.1 g of pyridinium p-toluenesulfonate as a crosslinking catalyst were added and dissolved to form a solution. Thereafter, the solution was filtered using a microfilter made of polyethylene having a pore size of 0.2 µm to prepare a solution of a composition for forming an organic hard mask layer used for a lithography process by using a multilayer film.

(Measurement of Optical Parameter)

The solutions of the compositions for forming an organic hard mask layer prepared in Examples 1 to 6 and Comparative Example 1 were applied onto silicon wafers using a spin coater. The coated wafers were baked on a hot plate at 240° C. for 1 minute to form organic hard mask layers (film thickness: 0.05 µm). Refractive indices (n values) and optical absorption coefficients (k values, also called attenuation coefficients) of these organic hard mask layers at a wavelength of 193 nm were measured by using a spectroscopic ellipsometer [manufactured by J.A. Woollam Co., VUV-VASE]. The results are shown in Table 1.

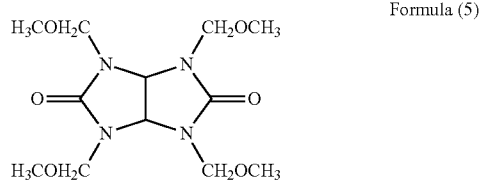

Formula (5)

TABLE 1

Refractive indices n and optical absorption coefficients k

|  |  | n (193 nm) | k (193 nm) |
|---|---|---|---|
| Example 1 | Film after baking at 240° C. | 1.60 | 0.39 |
| Example 2 | Film after baking at 240° C. | 1.62 | 0.40 |
| Example 3 | Film after baking at 240° C. | 1.58 | 0.52 |
| Example 4 | Film after baking at 240° C. | 1.62 | 0.41 |

TABLE 1-continued

Refractive indices n and optical absorption coefficients k

|  |  | n (193 nm) | k (193 nm) |
|---|---|---|---|
| Example 5 | Film after baking at 240° C. | 1.62 | 0.39 |
| Example 6 | Film after baking at 240° C. | 1.83 | 0.58 |
| Comparative Example 1 | Film after baking at 240° C. | 1.53 | 0.34 |

(Elution Test to Photoresist Solvent)

The solutions of the compositions for forming an organic hard mask layer prepared in Examples 1 to 6 and Comparative Example 1 were applied onto silicon wafers using a spin coater. The coated wafers were baked on a hot plate at 160° C. for 1 minute or 240° C. for 1 minute to form organic hard mask layers (film thickness: 0.20 μm). An immersion test of these organic hard mask layers into propylene glycol monomethyl ether, propylene glycol monomethyl ether acetate, and propylene glycol monoethyl ether that were solvents used for organic hard mask layers used as resists was carried out. The results are shown in Table 2. Retention of film thickness is a result obtained by immersing the organic hard mask layer in each solvent for 60 seconds, measuring the film thickness of the organic hard mask layer before and after the immersion, and calculating a value of (Film thickness after immersion)/(Film thickness before immersion)×100.

TABLE 2

Retention of film thickness after elution test

|  |  | Propylene glycol monomethyl ether | Propylene glycol monomethyl ether acetate | Propylene glycol monoethyl ether |
|---|---|---|---|---|
| Example 1 | Film after baking at 240° C. | 100% | 100% | 100% |
| Example 2 | Film after baking at 240° C. | 99% | 100% | 100% |
| Example 3 | Film after baking at 240° C. | 100% | 100% | 99% |
| Example 4 | Film after baking at 240° C. | 99% | 100% | 100% |
| Example 5 | Film after baking at 160° C. | 100% | 100% | 100% |
| Example 5 | Film after baking at 240° C. | 100% | 100% | 100% |
| Example 6 | Film after baking at 240° C. | 100% | 100% | 100% |
| Comparative Example 1 | Film after baking at 240° C. | 98% | 94% | 98% |

(Dissolution Test in Alkali Solution)

The solutions of the compositions for forming an organic hard mask layer prepared in Examples 1 to 6 and Comparative Example 1 were applied onto silicon wafers using a spin coater. The coated wafers were baked on a hot plate at 160° C. for 1 minute or 240° C. for 1 minute to form organic hard mask layers (film thickness: 0.20 μm). For these organic hard mask layers, an immersion into 2.38% tetramethylammonium hydroxide aqueous solution test was carried out. The results are shown in Table 3. Retention of film thickness is a result obtained by immersing the organic hard mask layer into 2.38% tetramethylammonium hydroxide aqueous solution for 60 seconds, measuring the film thickness of the organic hard mask layer before and after the immersion, and calculating a value of (Film thickness after immersion)/(Film thickness before immersion)×100.

TABLE 3

Retention of film thickness after dissolution test using alkali solution

| Example 1 | Film after baking at 240° C. | 0% |
|---|---|---|
| Example 2 | Film after baking at 240° C. | 0% |
| Example 3 | Film after baking at 240° C. | 0% |
| Example 4 | Film after baking at 240° C. | 0% |
| Example 5 | Film after baking at 160° C. | 0% |
| Example 5 | Film after baking at 240° C. | 100% |
| Example 6 | Film after baking at 240° C. | 100% |
| Comparative Example 1 | Film after baking at 240° C. | 100% |

(Measurement of $CF_4$ Gas Dry Etching Rate)

An etcher and an etching gas used for the measurement for the dry etching rate are as follows.

RIE-10NR (Manufactured by SAMCO Inc.): $CF_4$

The solutions of the compositions for forming an organic hard mask layer prepared in Examples 1 to 6 and Comparative Example 1 were applied onto silicon wafers using a spin coater. The coated wafers were baked on a hot plate at 240° C. for 1 minute to form organic hard mask layers (film thickness: 0.20 μm). A dry etching rate was measured by using $CF_4$ as the etching gas.

A solution of a cresol-novolac resin (Commercial product, a weight-average molecular weight is 4000) was applied onto a silicon wafer using a spin coater. The coated wafer was baked on a hot plate at 205° C. for 1 minute to form an organic hard mask layer (film thickness: 0.20 μm). A dry etching rate was measured by using $CF_4$ gas as the etching gas, and the dry etching rate was compared with the etching rates of the organic hard mask layers obtained from the compositions for forming an organic hard mask layer in Examples 1 to 6 and Comparative Example 1. The results are shown in Table 4. A rate ratio (1) is the ratio of the dry etching rate of (Organic hard mask layer used in Example)/(Cresol-novolac resin, a baked film at 205° C. for 1 minute).

TABLE 4

Dry etching rate ratio using $CF_4$ gas

| Example 1 | Rate ratio of film after baking at 240° C. (1) | 1.25 |
|---|---|---|
| Example 2 | Rate ratio of film after baking at 240° C. (1) | 1.21 |
| Example 3 | Rate ratio of film after baking at 240° C. (1) | 1.11 |
| Example 4 | Rate ratio of film after baking at 240° C. (1) | 1.23 |
| Example 5 | Rate ratio of film after baking at 240° C. (1) | 1.24 |
| Example 6 | Rate ratio of film after baking at 240° C. (1) | 1.19 |
| Comparative Example 1 | Rate ratio of film after baking at 240° C. (1) | 0.77 |

(Measurement of $O_2$ Dry Etching Rate)

An etcher and an etching gas used for the measurement of the dry etching rate are as follows.

RIE-10NR (Manufactured by SAMCO Inc.): $O_2$

The solutions of the compositions for forming an organic hard mask layer prepared in Examples 1 to 6 and Comparative Example 1 were applied onto silicon wafers using a spin coater. The coated wafers were baked on a hot plate at 240° C. for 1 minute to form organic hard mask layers (film thickness: 0.20 μm). A dry etching rate was measured by using $O_2$ gas as etching gas.

A solution of a cresol-novolac resin (Commercial product, a weight-average molecular weight is 4000) was applied onto a silicon wafer using a spin coater. The coated wafer was baked on a hot plate at 205° C. for 1 minute to form an organic hard mask layer (film thickness: 0.20 μm). A dry etching rate was measured by using $O_2$ gas as the etching gas, and the dry etching rate was compared with the etching rate of the organic hard mask layer obtained from the composition for forming an organic hard mask layer in Examples 1 to 6 and Comparative Example 1. The results are shown in Table 5. A rate ratio (1) is the ratio of the dry etching rate of (Organic hard mask layer used in Example)/(Cresol-novolac resin, a baked film at 205° C. for 1 minute).

TABLE 4

| | Dry etching rate ratio using $O_2$ gas | |
|---|---|---|
| Example 1 | Rate ratio of film after baking at 240° C. (1) | 1.27 |
| Example 2 | Rate ratio of film after baking at 240° C. (1) | 1.26 |
| Example 3 | Rate ratio of film after baking at 240° C. (1) | 1.09 |
| Example 4 | Rate ratio of film after baking at 240° C. (1) | 1.24 |
| Example 5 | Rate ratio of film after baking at 240° C. (1) | 1.24 |
| Example 6 | Rate ratio of film after baking at 240° C. (1) | 1.26 |
| Comparative Example 1 | Rate ratio of film after baking at 240° C. (1) | 0.90 |

From the result in Table 5, the resist pattern of the upper layer can be precisely transferred to the organic hard mask layer of the present invention because the dry etching rate by oxygen gas is high.

INDUSTRIAL APPLICABILITY

Whereas, conventionally, ashing had been used at the time of removal, the composition for forming an organic hard mask used at the lowest layer in the lithography process by using the multilayer film of the present invention can be removed by an alkaline aqueous solution, depending on selection of a crosslinking agent and a crosslinking catalyst, and as a result, damage to the substrate at the time of the removal is expected to be reduced. Moreover, the dry etching rate by oxygen gas is high, and thus, the pattern transferred to a silicon hard mask can be precisely transferred to the organic hard mask layer of the present invention.

The invention claimed is:

1. A method for manufacturing a semiconductor device, the method comprising:
    forming an organic hard mask layer on a semiconductor substrate using a composition for forming an organic hard mask layer comprising:
        a polymer (A) including a structural unit of Formula (1) and a structural unit of Formula (2), the structural unit of Formula (1) and the structural unit of Formula (2) having a molar ratio in the range of 1:0.01 to 1:1.5:
        a crosslinkable compound (B) including at least two of blocked isocyanate groups, methylol groups, or $C_{1-5}$ alkoxymethyl groups; and
        a solvent (C), wherein
        an organic hard mask obtained from the composition for forming an organic hard mask layer is used at the lowest layer in a lithography process using a multilayer film,

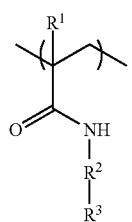

Formula (1)

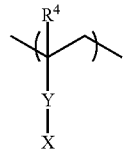

Formula (2)

[in Formula (1), $R^1$ is a hydrogen atom or a methyl group; $R^2$ is a $C_{1-3}$ alkylene group or a phenylene group optionally having a substituent; and $R^3$ is a hydroxy group or a carboxy group, and
in Formula (2), $R^4$ is a hydrogen atom or a methyl group; Y is a linking group of a —C(=O)—NH— group or a —C(=O)—O— group; X is a group including a lactone ring, a group including an adamantane ring, a benzene ring group that is not substituted, or a naphthalene ring group that is not substituted; and a carbon atom in the linking group of Y is bonded to a main chain of the polymer];
forming a resist film on the organic hard mask layer;
forming a resist pattern in the resist film by radiating light or an electron beam and developing;
etching the organic hard mask layer using the resist pattern; and
processing the semiconductor substrate using the organic hard mask layer thus patterned.

2. The method according to claim 1, wherein the polymer (A) is a polymer (A') further including a structural unit of Formula (3) in addition to the structural unit of Formula (1) and the structural unit of Formula (2),

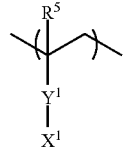

Formula (3)

[in Formula (3), $R^5$ is a hydrogen atom or a methyl group; $Y^1$ is a —C(=O)—NH—group or a —C(=O)—O— group; $X^1$ is a hydrogen atom, a $C_{1-10}$ alkyl group, or a $C_{7-20}$ aralkyl group that is optionally substituted].

3. The method according to claim 2, wherein the crosslinkable compound (B) is included in a ratio in the range of 1% by mass to 40% by mass to the mass of the polymer (A').

4. The method according to claim 1, wherein the polymer (A) is a polymer (A") further including a structural unit of Formula (4) in addition to the structural unit of Formula (1) and the structural unit of Formula (2),

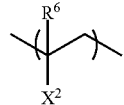

Formula (4)

[in Formula (4), $R^6$ is a hydrogen atom or a methyl group; and $X^2$ is a $C_{6-20}$ aryl group that is optionally substituted].

5. The method according to claim 4, wherein the crosslinkable compound (B) is included in a ratio in the range of 1% by mass to 40% by mass to the mass of the polymer (A").

6. The method according to claim 1, wherein the crosslinkable compound (B) is included in a ratio in the range of 1% by mass to 40% by mass to the mass of the polymer (A).

7. The composition method according to claim 1, further comprising a crosslinking catalyst.

8. A method for manufacturing a semiconductor device, the method comprising:
   forming an organic hard mask layer on a semiconductor substrate using a composition for forming an organic hard mask layer comprising:
      a polymer (A) including a. structural unit of Formula (1) and a structural unit of Formula (2), the structural unit of Formula (1 ) and the structural unit of Formula (2) having a molar ratio in the range of 1:0,01 to 1:1.5;
      a crosslinkable compound (B) including at least two of blocked isocyanate groups, methylol groups, or $C_{1-5}$ alkoxymethyl groups; and
      a solvent (C) wherein
      an organic hard mask layer obtained from the composition for forming an organic hard mask layer is used at the lowest layer in a lithography process using a multi-layer film,

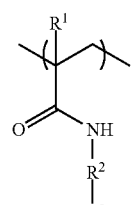

Formula (1)

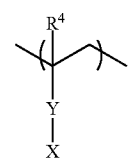

Formula (2)

[in Formula (1), $R^1$ is a hydrogen atom or a methyl group, $R^2$ is a $C_{1-3}$ alkylene group or a phenylene group optionally having a substituent; and $R^3$ is a hydroxy group or a carboxy group, and in Formula (2), $R^4$ is a hydrogen atom or a methyl group; Y is a linking group of a —C(=O)—NH— group or a —C(=O)—O— group; X is a group including a lactone ring, a group including an adamantane ring, a benzene ring group that is not substituted, or a naphthalene ring group that is not substituted; and a carbon atom in the linking group of Y is bonded to a main chain of the polymer];

forming an inorganic hard mask layer on the organic hard mask layer;

further forming a resist film on the inorganic hard mask layer;

forming a resist pattern in the resist film by radiating light or an electron beam and developing;

etching the inorganic hard mask layer using the resist pattern;

etching the organic hard mask layer using the inorganic hard mask layer thus patterned; and processing a semiconductor substrate using the organic hard mask layer thus patterned.

9. The method according to claim 8, wherein the polymer (A) is a polymer (A') further including a structural unit of Formula (3) in addition to the structural unit of Formula (1) and the structural unit of Formula (2),

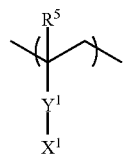

Formula (3)

[in Formula (3), $R^5$ is a hydrogen atom or a methyl group; $Y^1$ is a —C(=O)—NH—group or a —C(=O)—O— group; $X^1$ is a hydrogen atom, a $C_{1-10}$ alkyl group, or a $C_{7-20}$ aralkyl group that is optionally substituted].

10. The method according to claim 9, wherein the crosslinkable compound (B) is included in a ratio in the range of 1% by mass to 40% by mass to the mass of the polymer (A').

11. The method according to claim 8, wherein the polymer (A) is a polymer (A") further including a structural unit of Formula (4) in addition to the structural unit of Formula (1) and the structural unit of Formula (2),

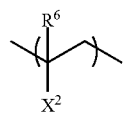

Formula (4)

[in Formula (4), $R^6$ is a hydrogen atom or a methyl group; and $X^2$ is a $C_{6-20}$ aryl group that is optionally substituted].

12. The method according to claim 11, wherein the crosslinkable compound (B) is included in a ratio in the range of 1% by mass to 40% by mass to the mass of the polymer (A").

13. The method according to claim 8, wherein the crosslinkable compound (B) is included in a ratio in the range of 1% by mass to 40% by mass to the mass of the polymer (A).

14. The method according to claim 8, further comprising a crosslinking catalyst.

* * * * *